United States Patent
Pan et al.

(10) Patent No.: US 6,313,034 B1
(45) Date of Patent: Nov. 6, 2001

(54) METHOD FOR FORMING INTEGRATED CIRCUIT DEVICE STRUCTURES FROM SEMICONDUCTOR SUBSTRATE OXIDATION MASK LAYERS

(75) Inventors: Yang Pan, Singapore (SG); Che-Chia Wei, Plano, TX (US)

(73) Assignee: Chartered Semiconductor Manufacturing, Singapore (SG)

(*) Notice: Subject to any disclaimer, the term of this patent is extended or adjusted under 35 U.S.C. 154(b) by 0 days.

(21) Appl. No.: 08/510,765

(22) Filed: Aug. 3, 1995

(51) Int. Cl.[7] ................................................. H01L 21/28

(52) U.S. Cl. ....................... 438/666; 438/669; 438/586; 438/237

(58) Field of Search ................................. 437/69, 70, 40, 437/41, 968; 148/DIG. 85, DIG. 86, DIG. 117; 438/669, 666, 586, 597, 237

(56) References Cited

U.S. PATENT DOCUMENTS

| | | | |
|---|---|---|---|
| 5,039,625 | * 8/1991 | Reisman et al. | |
| 5,260,229 | 11/1993 | Hodges et al. | 437/69 |
| 5,338,750 | 8/1994 | Tuan et al. | 437/70 |
| 5,338,968 | 8/1994 | Hodges et al. | 257/647 |
| 5,366,908 | * 11/1994 | Pelella. | |
| 5,372,956 | * 12/1994 | Baldi. | |

FOREIGN PATENT DOCUMENTS

63289820 * 11/1988 (JP).
5198567 * 8/1993 (JP).

OTHER PUBLICATIONS

Kangar, A., et al, "An Integrated Isolation/Gate Process for Sub–Quarter Micron Technologies", May 1993 Symposium on VLSI Tech. pp 141–2.*

Hillenius, S. J., et al, "Integration of Poly Buffered LOCOS . . . Isolation Technique", IEEE Trans. on Electron Devices, vol. 38, No. 12, Dec. 1991, p. 2721.*

* cited by examiner

Primary Examiner—George Fourson
(74) Attorney, Agent, or Firm—George O. Saile; Rosemary L. S. Pike; Alek P. Szecsy

(57) ABSTRACT

A method for forming integrated circuit device structures upon active semiconductor regions of a semiconductor substrate. The active semiconductor regions are defined by Field OXide (FOX) isolation regions which are formed through a Polysilicon Buffered LOCal Oxidation of Silicon (PBLOCOS) oxidation mask structure. The PBLOCOS oxidation mask structure includes a blanket pad oxide layer which resides upon the semiconductor substrate, a blanket polysilicon buffer layer which resides upon the blanket pad oxide layer and a patterned silicon nitride layer which resides upon the blanket polysilicon buffer layer. Portions of the blanket polysilicon buffer layer and the blanket pad oxide layer exposed through the patterned silicon nitride layer are completely consumed to leave remaining the patterned silicon nitride layer, a patterned polysilicon buffer layer and a patterned pad oxide layer upon the active regions of the semiconductor substrate which are separated by the FOX isolation regions. The portions of the patterned silicon nitride layer, the patterned polysilicon buffer layer and the patterned pad oxide layer are employed in forming integrated circuit device structures upon the active semiconductor region of the semiconductor substrate.

7 Claims, 2 Drawing Sheets

METHOD FOR FORMING INTEGRATED CIRCUIT DEVICE STRUCTURES FROM SEMICONDUCTOR SUBSTRATE OXIDATION MASK LAYERS

BACKGROUND OF THE INVENTION

1. Field of the Invention

The present invention relates generally to methods for manufacture of integrated circuit devices upon semiconductor substrates possessing oxide isolation regions. More particularly, the present invention relates to a method for using within the fabrication of integrated circuit devices upon a semiconductor substrate portions of masking structures used for forming oxide isolation regions upon the semiconductor substrate.

2. Description of Related Art

Integrated circuits are typically fabricated upon semiconductor substrates within and upon whose surfaces are formed resistors, transistors, diodes, capacitors and other electrical circuit elements. These electrical circuit elements are connected internally and externally to the semiconductor substrate upon which they are formed through conductor metallization layers which are separated by insulator layers.

In order to assure optimal performance of advanced integrated circuits it is important that individual integrated circuit devices within those integrated circuits be sufficiently electrically isolated from one another. The method through which this electrical isolation has traditionally most commonly been accomplished is through formation of Field OXide (FOX) isolation regions surrounding discrete integrated circuit devices or integrated circuit device cells. FOX isolation regions are commonly formed through a LOCal Oxidation of Silicon (LOCOS) method whereby portions of a silicon semiconductor substrate exposed through a LOCOS oxidation mask structure are oxidized to form FOX isolation regions. The more advanced LOCOS oxidation mask structures, such as Polysilicon Buffered LOCOS (PBLOCOS) employ multiple layers of masking materials to achieve fine line-width and defect-free FOX regions which substantially reduce parasitic effects between adjoining integrated circuit devices or device cells.

Masking layers which are typically employed in a PBLOCOS oxidation mask structure for forming FOX isolation regions upon a semiconductor substrate include: (1) a blanket pad oxide layer immediately adjoining a semiconductor substrate, (2) a blanket polysilicon buffer layer upon the blanket pad oxide layer, which blanket polysilicon buffer layer absorbs stresses due to variations in coefficients of thermal expansion of masking layers within the LOCOS oxidation mask structure, and (3) a patterned silicon nitride insulating layer which provides a surface impervious to the oxidation environment to which exposed portions of the blanket polysilicon buffer layer and the blanket pad oxide layer will subsequently be exposed when forming FOX isolation regions. Subsequent to forming FOX isolation regions, the masking layers are typically stripped from the surface of the semiconductor substrate to leave remaining active regions of a semiconductor substrate which are defined by the FOX isolation regions within and upon the semiconductor substrate. Within the active regions are then formed the electrical circuit elements to be interconnected to form integrated circuits upon the semiconductor substrate.

Although the PBLOCOS method has served well in providing functional and reliable FOX isolation regions within integrated circuits, the multiple masking processes employed within the PBLOCOS method may be involved and time consuming. The problem to which the present invention is directed is to effectively utilize within semiconductor structures to be formed upon active semiconductor substrate regions protected beneath PBLOCOS oxidation mask structures portions of those PBLOCOS oxidation mask structures which previously protected those active semiconductor substrate regions. By using portions of those PBLOCOS oxidation mask structures when forming integrated circuit device structures upon active semiconductor substrate regions previously protected by those PBLOCOS oxidation mask structures, there may be designed an economical integrated circuit manufacturing process which efficiently uses PBLOCOS oxidation mask structures.

Methods through which PBLOCOS oxidation mask structures may be formed and modified upon semiconductor substrates are known in the art. For example, Hodges et at. in U.S. Pat. Nos. 5,260,229 and 5,338,968 disclose methods by which exposed edges of polysilicon buffer layers within PBLOCOS oxidation mask structures may be masked such that those exposed polysilicon buffer layer edges are not susceptible to oxidation when the semiconductor substrate upon which is formed the PBLOCOS oxidation mask structure is exposed to an oxidizing environment. In addition, Tuan et al. in U.S. Pat. No. 5,338,750 disclose a method for forming and removing a LOCOS oxidation mask structure from a semiconductor substrate whereby pits are not formed in the semiconductor substrate upon which resided the LOCOS oxidation mask structure.

Desirable in the art are methods through which portions of a PBLOCOS oxidation mask structure employed in forming FOX isolation regions upon a semiconductor substrate may be employed in forming portions of integrated circuit device structures upon the semiconductor substrate region which the PBLOCOS oxidation mask structure protected. Such methods would provide for economical manufacturing processes which efficiently utilize the materials from which PBLOCOS oxidation mask structures are formed. Moreover, such methods may also provide for reductions in defect densities attributable to processes through which PBLOCOS oxidation mask structures are removed. Such reductions in defect densities would, in turn, provide higher semiconductor yields.

SUMMARY OF THE INVENTION

The object of the present invention is to provide an integrated circuit fabrication method whereby portions of a PBLOCOS oxidation mask structure formed upon a semiconductor substrate may be employed in forming upon the active semiconductor regions protected by that PBLOCOS oxidation mask structure elements needed in the formation of integrated circuit device structures upon the active semiconductor regions.

In accord with the object of the present invention, a method for employing PBLOCOS oxidation mask structures in forming integrated circuit device structures upon active semiconductor regions previously protected by those PBLOCOS oxidation mask structures is disclosed. A Polysilicon Buffered LOCal Oxidation of Silicon (PBLOCOS) mask structure is first formed upon the surface of a semiconductor substrate. The PBLOCOS mask structure comprises a blanket pad oxide layer formed upon the surface of the semiconductor substrate, a blanket polysilicon buffer layer formed upon the surface of the blanket pad oxide layer and a patterned silicon nitride layer formed upon the surface of the blanket polysilicon buffer layer. The portions of the blanket polysilicon buffer layer and the blanket pad oxide layer exposed through the patterned silicon nitride layer are then completely oxidized to form within and upon the surface of the semiconductor substrate Field OXide (FOX) isolation regions which separate active semiconductor regions of the semiconductor substrate. Upon the active semiconductor regions reside remaining portions of the PBLOCOS oxidation mask structure which include the patterned silicon nitride layers which reside upon patterned polysilicon buffer layers, which patterned polysilicon buffer layers in turn reside upon patterned pad oxide layers. Additional patterning of portions of the patterned silicon nitride layer, the patterned polysilicon buffer layer and the patterned pad oxide layer yield portions of integrated circuit device structures formed upon the active semiconductor region of the semiconductor substrate.

The method of the present invention provides efficient usage of layers of materials from which are formed PBLOCOS oxidation mask structures. Through the additional patterning of portions of PBLOCOS oxidation mask structures remaining after FOX isolation regions are formed upon a semiconductor substrate, substantial quantities of materials and semiconductor processing equipment time may be saved in forming upon active semiconductor regions of the semiconductor substrate portions of integrated circuit device structures.

BRIEF DESCRIPTION OF THE DRAWINGS

The accompanying drawings, which form a material portion of this application, show the following.

DESCRIPTION OF THE PREFERRED EMBODIMENTS

The present invention provides a simplified method by which integrated circuit device structures may be formed upon the active semiconductor regions of semiconductor substrates, which semiconductor substrates have formed within and upon their surfaces Field OXide (FOX) isolation regions. The present invention provides that portions of a Polysilicon Buffered LOCal Oxidation of Silicon (PBLOCOS) oxidation mask structure remaining upon a semiconductor substrate after other portions of the PBLOCOS oxidation mask structure have been consumed to form FOX isolation regions may be patterned to form upon the active regions of the semiconductor substrate portions of integrated circuit device structures. By forming portions of integrated circuit device structures in this fashion, substantial efficiencies may be realized in semiconductor manufacturing equipment usage and materials consumption.

The method of the present invention may be employed in any semiconductor manufacturing process wherein: (1) a PBLOCOS oxidation mask structure is employed to form within and upon a semiconductor substrate FOX isolation regions which separate active semiconductor regions of the semiconductor substrate, and (2) the portions of the PBLOCOS isolation mask structure remaining upon the semiconductor substrate after the FOX isolation regions are formed may be used for portions of integrated circuit device structures formed upon the active semiconductor region of the semiconductor substrate.

The method of the present invention may be employed in forming integrated circuit device structures within various types of integrated circuit device chips. The method of the present invention may be employed in forming integrated circuit device structures within Dynamic Random Access Memory (DRAM) integrated circuit device chips, Static Random Access Memory (SRAM) integrated circuit device chips, Application Specific Integrated Circuit (ASIC) integrated circuit device chips, and integrated circuit device chips having within their fabrications field effect transistors. The method of the present invention had broad applicability within integrated circuit chip fabrication technology.

Referring now to FIG. 1a to FIG. 1e there is shown a series of schematic cross-sectional diagrams which illustrates the progressive stages of fabrication of a pair of field effect transistors in accord with the preferred embodiment of the present invention. In addition to field effect transistors, structures within other integrated circuit devices may also be formed through the method of the present invention. These structures include but are not limited to insulator structures and conductor structures.

Figure 1A:
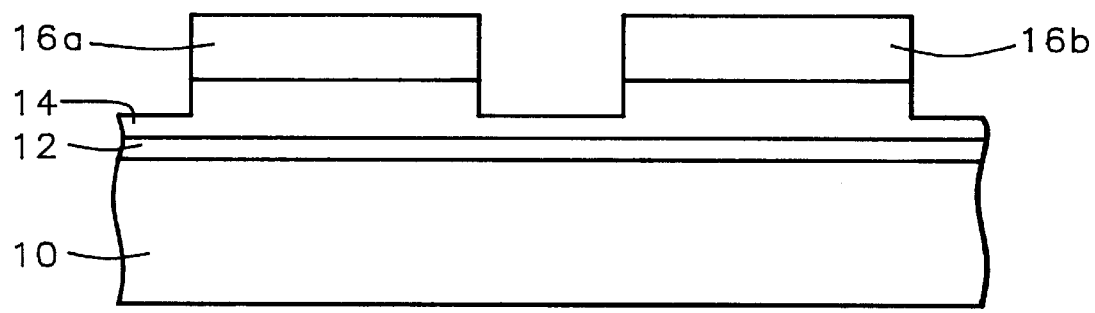
FIG. 1a to FIG. 1e show schematic cross-sectional diagrams which illustrate a semiconductor substrate upon which is formed integrated circuit devices in accord with the preferred embodiment of the present invention.

The earliest stages in fabrication of the field effect transistors which comprise the preferred embodiment of the present invention are illustrated in FIG. 1a. Shown in FIG. 1a is a semiconductor substrate 10 upon whose surface is formed a PBLOCOS oxidation mask structure. Although the present invention may be practiced upon semiconductor substrates of either dopant polarity, varying dopant concentrations and varying crystallographic orientations, the present invention will typically be practiced upon a semiconductor substrate 10 having a (100) crystallographic orientation and either a P- or N-polarity.

The layers of the PBLOCOS oxidation mask structure which are formed upon the surface of the semiconductor substrate 10 include the blanket pad oxide layer 12, the blanket polysilicon buffer layer 14 and the patterned silicon nitride layers 16a and 16b. The PBLOCOS oxidation mask structure, as well as each of the three layers within the PBLOCOS oxidation mask structure, are conventional to the art. For example, blanket pad oxide layers may be formed upon semiconductor substrate surfaces through methods including but not limited to thermal oxidation methods whereby the surface of the semiconductor substrate is oxidized to form a pad oxide layer, and methods whereby a blanket layer of pad oxide material is independently formed upon the surface of the semiconductor substrate through a Chemical Vapor Deposition (CVD) or Plasma Enhanced Chemical Vapor Deposition (PECVD) employing a suitable silicon source material.

In addition, blanket polysilicon layers may be formed upon semiconductor substrate surfaces through methods including but not limited to Chemical Vapor Deposition (CVD) methods and Plasma Enhanced Chemical Vapor Deposition (PECVD) methods which employ as silicon source materials gasses such as silane, disilane or silicon chloride. Finally, patterned silicon nitride layers may be formed upon semiconductor substrate surfaces via patterning through methods as are conventional in the art of blanket silicon nitride layers formed upon semiconductor substrate surfaces. Blanket silicon nitride layers may be formed upon semiconductor substrate surfaces through methods including but not limited to Chemical Vapor Deposition (CVD) methods and Plasma Enhanced Chemical Vapor Deposition (PECVD) methods employing suitable silicon and nitrogen source materials. Also known in the art are Rapid Thermal Nitridation (RTN) methods through which silicon oxide layers formed upon a semiconductor substrate surface may be nitrided.

While any combination of the above methods and materials may be employed to provide the PBLOCOS oxidation mask structure of the preferred embodiment of the present invention, the blanket pad oxide layer 12 will typically be formed through a thermal oxidation process by which a portion of the semiconductor substrate 10 will be consumed in forming the blanket pad oxide layer 12. In addition, the blanket polysilicon buffer layer 14 will typically be formed through a Chemical Vapor Deposition (CVD) process employing either silane or disilane as the silicon source material. Finally, the patterned silicon nitride layers 16a and 16b will typically be formed through a Chemical Vapor Deposition (CVD) method employing dichlorosilane and ammonia as the silicon source material and the nitrogen source material, respectively.

For the preferred embodiment of the present invention, the blanket pad oxide layer 12 is preferably about 50 to about 300 angstroms thick, the blanket polysilicon buffer layer 14 is preferably about 500 to about 5000 angstroms thick, and the patterned silicon nitride layers 16a and 16b are each preferably about 500 to about 5000 angstroms thick. As shown in FIG. 1a, the blanket polysilicon buffer layer 14 within the PBLOCOS oxidation mask structure is preferably etched using as a mask the patterned silicon nitride layers 16a and 16b, to leave remaining lesser exposed thicknesses of the blanket polysilicon layer 14 in those etched areas of about 250 to about 2500 angstroms.

Figure 1B:
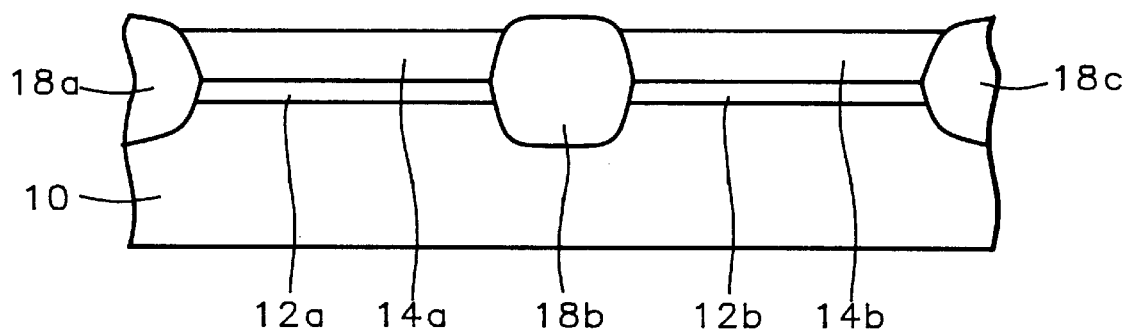

Referring now to FIG. 1b there is shown the next series of process steps in accord with the preferred embodiment of the present invention. Shown in FIG. 1b is the PBLOCOS oxidation mask structure of FIG. 1a wherein the portions of the blanket polysilicon buffer layer 14 and the blanket pad oxide layer 12 exposed through the patterned silicon nitride layers 16a and 16b have been oxidized to form the FOX isolation regions 18a, 18b and 18c within and upon the semiconductor substrate 10. Simultaneous with forming FOX isolation regions 18a, 18b and 18c is the formation of the patterned pad oxide layers 12a and 12b from the blanket pad oxide layer 12, and patterned polysilicon buffer layers 14a and 14b from the blanket polysilicon buffer layer 14. Methods through which FOX isolation regions may in general be formed through PBLOCOS oxidation mask structures are known in the art. Such methods include but are not limited to dry thermal oxidation methods, wet thermal oxidation methods employing steam as a source of moisture and high pressure oxidation methods.

For the preferred embodiment of the present invention, it is important that the thermal oxidation process whereby the portions of the blanket polysilicon buffer layer 14 and the blanket pad oxide layer 12 exposed through the patterned silicon nitride layers 16a and 16b are oxidized to form the FOX isolation regions 18a, 18b and 18c is controlled sufficiently such that thermal damage does not occur to the portions of the patterned polysilicon buffer layers 14a and 14b, and the patterned pad oxide layers 12a and 12b remaining beneath the patterned silicon nitride layers 16a and 16b. It has been found experimentally that thermal damage to the patterned polysilicon buffer layers 14a and 14b, and the patterned pad oxide layers 12a and 12b is limited when the FOX isolation regions 18a, 18b and 18c are formed within and upon the semiconductor substrate 10 at comparatively low temperature and high pressure conditions. Thus, for the preferred embodiment of the present invention, the FOX isolation regions 18a, 18b and 18c are preferably formed at about 850 to about 1100 degrees centigrade and about 1 to about 25 atmospheres pressure.

Also shown by reference to FIG. 1b is the absence of the patterned silicon nitride layers 16a and 16b. For the preferred embodiment of the present invention, the patterned silicon nitride layers 16a and 16b have been removed since the integrated circuit structures to be formed upon the active semiconductor region of the semiconductor substrate 10 for the preferred embodiment of the present invention do not include a structure which requires a multi-layer stack wherein a silicon nitride layer resides upon a polysilicon layer which in turn resides upon a silicon oxide layer. Should it be desirable to form upon a semiconductor substrate a multi-layer stack comprised of those three layers, the patterned silicon nitride layers 16a and 16b would preferably remain upon the surfaces of the patterned polysilicon buffer layers 14a and 14b rather than removing them completely from the surfaces of the patterned polysilicon buffer layers 14a and 14b. For the preferred embodiment of the present invention, the patterned silicon nitride layers 16a and 16b may be removed through methods as are conventional in the art, including but not limited to wet chemical and dry plasma etching techniques.

In general, integrated circuit device structures may be formed upon active semiconductor regions from PBLOCOS oxidation mask structures under any or all of the following three conditions: (1) the integrated circuit device structure employs portions of the patterned silicon nitride layer, the patterned polysilicon buffer layer and the patterned pad oxide layer; (2) the integrated circuit device structure employs portions of the patterned polysilicon buffer layer and the patterned pad oxide layer; or (3) the integrated circuit device structure employs portions of the patterned pad oxide layer. Integrated circuit device structures will not typically employ upper layers of the PBLOCOS oxidation mask structure unless layers immediately beneath those upper PBLOCOS oxidation mask structure layers are also employed.

Figure 1C:
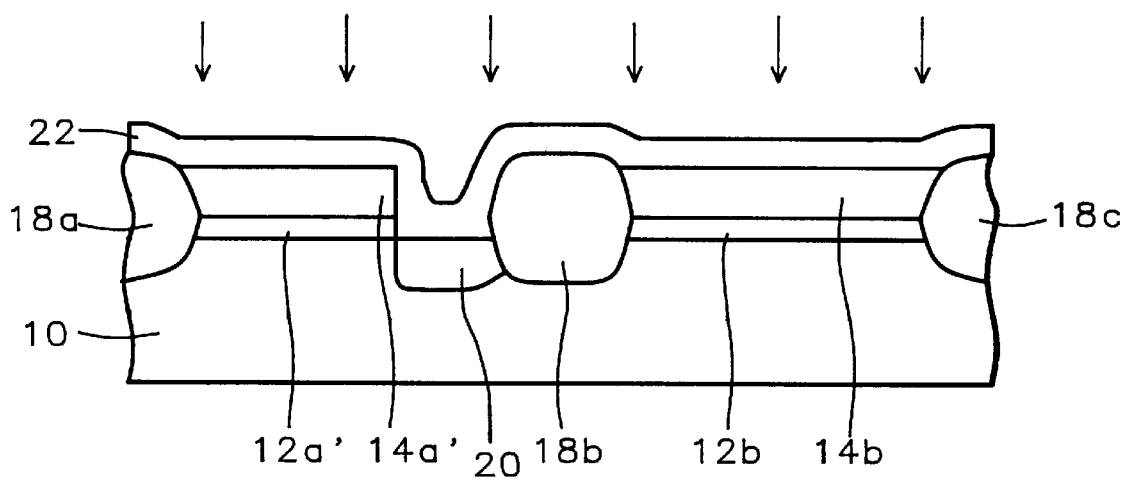

Referring now to FIG. 1c, there is shown a cross-sectional diagram illustrating the next series of process steps in accord with the preferred embodiment of the present invention. Shown in FIG. 1c is an additional patterning of the patterned polysilicon buffer layer 14a and the patterned pad oxide layer 12a to yield the patterned polysilicon buffer layer 14a' and the patterned pad oxide layer 12a'. Upon completion of this additional patterning, there is left exposed a portion of the semiconductor substrate 10 adjoining the FOX isolation region 18b. Into this exposed semiconductor substrate 10 region is formed a source/drain electrode 20.

Source/drain electrodes may typically be formed into semiconductor substrates through implanting dopant ions into the semiconductor substrate. The polarity of the source/drain electrode will dictate the choices of dopant ion to be used in the ion implant process. Typical dopant ions include but are not limited to arsenic dopant ions, boron dopant ions, boron difluoride dopant ions and phosphorus dopant ions. For the preferred embodiment of the present invention, the source/drain electrode 20 may be formed of either polarity through implanting into the semiconductor substrate either arsenic dopant ions, boron dopant ions, boron difluoride dopant ions or phosphorus dopant ions, preferably at an ion implantation dose of about 1E15 to about 5E15 ions per square centimeter and an ion implantation energy of about 10 to about 100 keV. Alternatively, the source/drain electrode 20 may be formed by diffusing dopants from a blanket second polysilicon layer 22. The blanket second polysilicon layer 22 may, in turn, have previously been doped through an ion implant process, a thermal diffusion process employing phosphorus oxy-chloride or an in-situ process involving co-deposition of suitable dopant species with the silicon source material from which is formed the blanket second polysilicon layer 22.

Although not directly illustrated in FIG. 1c it is also possible to implant dopant ions into the patterned polysilicon buffer layers 14a' and 14b while simultaneously forming the source/drain electrode 20 into the semiconductor substrate 10. Under such circumstances, the dose and polarity of dopant ions received by the patterned polysilicon buffer layers 14a' and 14b will be the same as the dose and polarity of dopant ions received by the semiconductor substrate in forming the source/drain electrode 20. As an alternative or an adjunct to doping the patterned polysilicon buffer layers 14a' and 14b simultaneously with forming the source/drain electrode 20, the patterned polysilicon buffer layers 14a' and 14b may also be doped prior to forming the patterned silicon nitride layers 16a and 16b upon the surface of the blanket polysilicon buffer layer 14. Regardless of the point in processing at which the patterned polysilicon buffer layers 14a' and 14b receive a dose of dopant ion to make those layers conductive, it is preferred that those layers receive a ion implant dose of about 1E15 to about 5E15 ions per square centimeter at an ion implantation energy of about 10 to about 50 keV. The polarity of the dopant to be received by the polysilicon buffer layers 14a' and 14b will vary according to the polarity of the integrated circuit device desired to be formed.

Finally, there is shown in FIG. 1c a blanket second polysilicon layer 22 formed upon the surface of the semiconductor substrate 10. The blanket second polysilicon layer 22 is preferably formed under conditions similar to the conditions employed in forming the blanket polysilicon buffer layer 14. Specifically, the blanket second polysilicon layer 22 is typically formed through a Chemical Vapor Deposition (CVD) process employing either silane or disilane as the silicon source material. The blanket second polysilicon layer 22 is preferably about 500 to about 5000 angstroms thick. As illustrated in FIG. 1c, the blanket second polysilicon layer is also doped, preferably through methods analogous to those employed in doping the patterned polysilicon buffer layers 14a' and 14b. The doping provided to the blanket second polysilicon layer 22 is preferably the same polarity and the same concentration as the doping provided to the patterned polysilicon buffer layers 14a' and 14b.

Figure 1D:
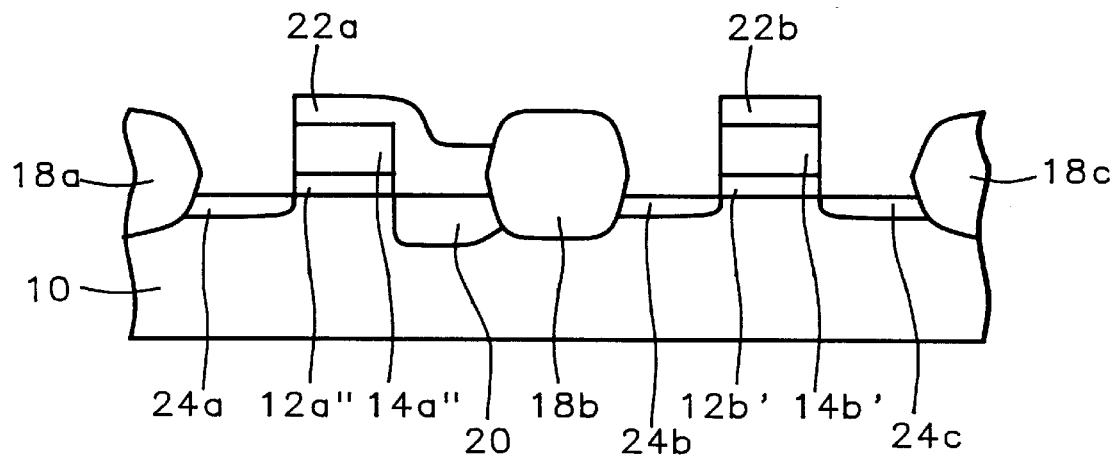

Referring now to FIG. 1d, there is shown a schematic cross-sectional diagram illustrating the next series of process steps in accord with the preferred embodiment of the present invention. Shown in FIG. 1d are patterned polysilicon buffer layers 14a" and 14b' and patterned pad oxide layers 12a" and 12b' upon which reside patterned second polysilicon layers 22a and 22b, respectively. Similarly, to the additional patterning of the patterned polysilicon buffer layer 14a and the patterned pad oxide layer 12a into the patterned polysilicon buffer layer 14a' and the patterned pad oxide layer 12a', the patterning of the patterned polysilicon buffer layers 14a' and 14b, the patterned pad oxide layers 12a' and 12b and the blanket second polysilicon layer 22 into the patterned polysilicon buffer layers 14a" and 14b', the patterned pad oxide layers 12a" and 12b' and the patterned second polysilicon layers 22a and 22b may be accomplished through methods as are conventional in the art. Typically, but not exclusively, this patterning will involve dry etching through a Reactive Ion Etch (RIE) process employing chlorine and/or fluorine containing species.

Upon completion of the patterning, there is next formed into the semiconductor substrate 10 the low dose ion implants 24a, 24b and 24c, which assist in assuring optimal operation of the field effect transistors of the present invention. The low dose ion implants 24a, 24b and 24c are formed of the same polarity as the source/drain electrode 20, but with significantly lower ion implantation dose and ion implantation energy. Dopant ions which may be employed in forming the low dose ion implants 24a, 24b and 24c are the same as the dopant ions employed in forming the source/drain electrode 20, which dopant ions include but are not limited to arsenic dopant ions, boron dopant ions, boron difluoride dopant ions and phosphorus dopant ions. Preferred ion implantation conditions for forming the low dose ion implants 24a, 24b and 24c are about 1E13 to about 1E14 ions per square centimeter ion implantation dose and about 15 to about 100 keV ion implantation energy.

Figure 1E:
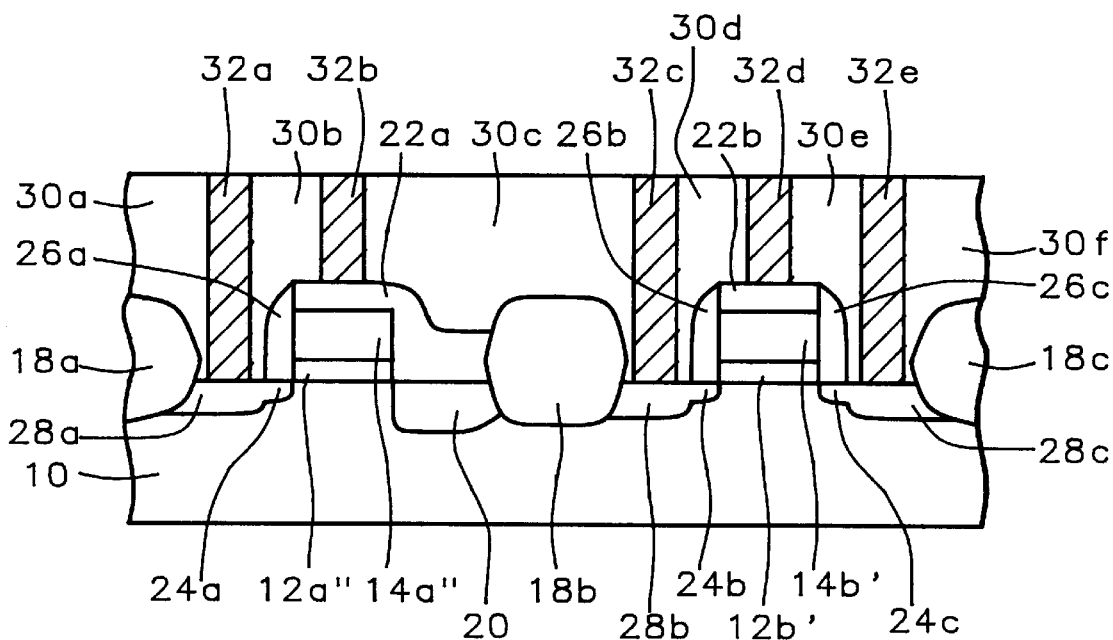

Referring now to FIG. 1e, there is shown a cross-sectional diagram illustrating the last series of process steps in accord with the preferred embodiment of the present invention. Shown in FIG. 1e is the presence of gate electrode spacers 26a, 26b and 26c which are formed at the one exposed end of the patterned pad oxide layer 12a", the patterned polysilicon buffer layer 14a" and patterned second polysilicon layer 22a, and at the two exposed ends of the patterned pad oxide layer 12b', the patterned polysilicon buffer layer 14b' and patterned second polysilicon layer 22b. The gate electrode spacers 26a, 26b and 26c are employed to provide proper spacing of the source/drain electrodes to be formed into the semiconductor substrate 10 from the edges of the patterned polysilicon buffer layers 14a" and 14b' which form the lower portions of the gate electrodes within the two field effect transistors of the preferred embodiment of the present invention.

Methods and materials through which gate electrode spacers may be formed within integrated circuits are well known in the art. Gate electrode spacers are typically formed through Reactive Ion Etch (RIE) etching of a blanket layer of gate electrode spacer material formed upon the surface of a semiconductor substrate. Gate electrode spacer materials include but are not limited to silicon oxides, silicon nitrides and silicon oxynitrides.

For the preferred embodiment of the present invention, the gate electrode spacers 26a, 26b and 26c are preferably formed through a Reactive Ion Etch (RIE) etching of a blanket layer of either silicon oxide, silicon nitride or silicon oxynitride formed upon the surface of the semiconductor substrate 10. Preferably the blanket layer of silicon oxide, silicon nitride or silicon oxynitride is about 500 to about 3000 angstroms thick.

After the gate electrode spacers 26a, 26b and 26c are formed, the source/drain electrodes 28a, 28b and 28c are formed into the surface of the semiconductor substrate 10 using as a mask the FOX isolation region 18a and the gate electrode spacer 26a, the FOX isolation region 18b and the gate electrode spacer 26b, and the FOX isolation region 18c and the gate electrode spacer 26c. The polarities of the source/drain electrodes 28a, 28b and 28c are the same as the polarities of the low dose ion implants 24a, 24b and 24c, and the source/drain electrode 20. The source/drain electrodes 28a, 28b and 28c are typically formed through an ion implantation process analogous to the ion implantation process by which is formed the source/drain electrode 20. Preferably, the source/drain electrodes 28a, 28b and 28c will be formed through ion implantation at an ion implantation dose of about 1E15 to about 5E15 ions per square centimeter and an ion implantation energy of about 15 to about 100 keV. Upon complete formation of the source/drain electrodes 28a, 28b and 28c, there is formed into the semiconductor substrate 10 a series of Lightly Doped Drain (LDD) source/drain electrode structures which includes those three source/drain electrodes. The LDD source/drain electrode structures assist in assuring limited sub-threshold currents in the field effect transistors of the preferred embodiment of the present invention.

Also shown in FIG. 1e is the presence of patterned first insulator layers 30a, 30b, 30c, 30d, 30e and 30f. Patterned insulator layers are typically formed via patterning through photolithographic and etching methods as are conventional in the art of blanket first insulating layers formed upon the surface of a semiconductor substrate. Although they may be formed of other materials, blanket first insulating layers are typically formed of silicon oxide materials which may be formed upon semiconductor surfaces through methods including but not limited to Chemical Vapor Deposition (CVD) methods, Plasma Enhanced Chemical Vapor Deposition (PECVD) methods and Physical Vapor Deposition (PVD) sputtering methods.

For the preferred embodiment of the present invention, the patterned first insulating layers 30a, 30b, 30c, 30d, 30e and 30f are preferably formed upon the semiconductor substrate 10 through patterning through photolithographic and etching techniques as are conventional in the art of a blanket first insulating layer formed from a silicon oxide material. The apertures between the patterned first insulating layers are etched sufficiently deeply to expose the surfaces of either the source/drain electrodes 28a, 28b and 28c, or the patterned second polysilicon layers 22a and 22b. As illustrated in FIG. 1e the patterned first insulating layers 30a, 30b, 30c, 30d, 30e and 30f, and the blanket first insulating layer from which those patterned first insulating layers are formed are planarized. Planarizing processes for insulating layers within integrated circuits include but are not limited to dry etching etch-back processes and chemical-mechanical wet etching methods.

Finally, there is illustrated in FIG. 1e the presence of first conductive contact studs 32a, 32b, 32c, 32d and 32e which make contact, respectively, with the source/drain electrode 28a, the patterned second polysilicon layer 24a, the source/drain electrode 28b, the patterned second polysilicon layer 24b and the source/drain electrode 28c. Conductive contact studs are conventional to the art. Although tungsten conductive contact studs are most common to the art, conductive contact studs may also be formed from other highly conductive materials such as other metals, metal alloys and polysilicon. In addition, there is often formed beneath conductive contact studs barrier layers formed from materials including but not limited to silicide materials and nitride materials.

For the preferred embodiment of the present invention, the conductive contact studs 32a, 32b, 32c, 32d and 32e may be formed from any material from which conductive contact studs are conventionally formed. The conductive contact studs 32a, 32b, 32c, 32d and 32e are formed of a thickness sufficient to reach the top surfaces of the patterned first insulating layers 30a, 30b, 30c, 30d, 30e and 30f.

Upon forming the conductive contact studs 32a, 32b, 32c, 32d and 32e there is formed the integrated circuit structure of the preferred embodiment of the present invention, which integrated circuit structure contains a pair of field effect transistors formed therein. Within the integrated circuit structure of the preferred embodiment of the present invention, the patterned pad oxide layers 12a" and 12b' form the gate oxide layers of the pair of field effect transistors. The patterned polysilicon buffer layers 14a" and 14b' form the corresponding lower portions of the gate electrodes of the pair of field effect transistors. Thus, the preferred embodiment of the present invention provides a pair of field effect transistor integrated circuit devices within an integrated circuit wherein portions of the field effect transistor structures are formed from portions of a LOCOS oxidation mask through which FOX isolation regions are previously formed upon the semiconductor substrate.

As will be understood by a person skilled in the art, the preferred embodiment of the present invention is not intended to limit the embodiments which are within the scope of the present invention. For example, integrated circuit device structures other than field effect transistor structures may also be formed upon active semiconductor regions through patterning of LOCOS oxidation mask structures which reside upon those active semiconductor regions. In addition, revisions to the ordering and quantity of the process steps disclosed within the preferred embodiment of the present invention may also yield embodiments which are within the spirit and scope of the present invention.

What is claimed is:

1. A method for forming an integrated circuit device structure upon a semiconductor substrate comprising:

forming upon a semiconductor substrate a Polysilicon Buffered LOCal Oxidation of Silicon (PBLOCOS) oxidation mask structure, the PBLOCOS oxidation mask structure comprising:
  a blanket pad oxide layer formed upon the semiconductor substrate;
  a blanket polysilicon buffer layer formed upon the blanket pad oxide layer; and
  a patterned silicon nitride layer formed upon the blanket polysilicon buffer layer;

forming a pair of Field OXide (FOX) isolation regions through complete thermal oxidation of portions of the blanket polysilicon buffer layer and the blanket pad oxide layer exposed adjoining the patterned silicon nitride layer of the PBLOCOS oxidation mask structure, the pair of FOX isolation regions when completely formed defining an active semiconductor region of the semiconductor substrate, the active semiconductor region having formed thereupon a patterned pad oxide layer upon which is formed a patterned polysilicon buffer layer upon which in turn is formed the patterned silicon nitride layer;

removing from the patterned polysilicon buffer layer the patterned silicon nitride layer;

etching sequentially the patterned polysilicon buffer layer and the patterned pad oxide layer to yield an etched patterned polysilicon buffer layer and an etched patterned pad oxide layer which leave exposed a first portion of the active semiconductor region of the semiconductor substrate;

forming over the etched patterned polysilicon buffer layer, the etched patterned pad oxide layer and the first portion of the active semiconductor region of the semiconductor substrate a blanket second polysilicon layer; and etching sequentially the blanket second polysilicon layer, the etched patterned polysilicon buffer layer and the etched patterned pad oxide layer to leave exposed a second portion of the active semiconductor region of the semiconductor substrate separated from the first portion of the active semiconductor region of the semiconductor substrate by a twice etched patterned pad oxide layer and a twice etched patterned polysilicon buffer layer, where:

the twice etched patterned pad oxide layer forms a gate oxide layer within a field effect transistor;

the twice etched patterned polysilicon buffer layer forms at least in part a gate electrode within the field effect transistor; and an etched second polysilicon layer formed from the blanket second polysilicon layer forms a shunt between the gate electrode of the field effect transistor and a first source/drain electrode of the field effect transistor, where the first source/drain electrode of the field effect transistor is formed within the first portion of the active semiconductor region of the semiconductor substrate.

2. The method of claim 1 wherein the blanket pad oxide layer is from about 50 to about 300 angstroms thick.

3. The method of claim 1 wherein the blanket polysilicon buffer layer is from about 500 to about 5000 angstroms thick.

4. The method of claim 1 wherein the patterned silicon nitride layer is from about 500 to about 5000 angstroms thick.

5. The method of claim 1 wherein the pair of FOX isolation regions is formed through thermal oxidation at a temperature of about 850 to about 1100 degrees centigrade and a pressure of about 1 to about 25 atmospheres.

6. The method of claim 1 further comprising forming a minimum of one Low Dose Drain (LDD) source/drain electrode structure within the field effect transistor structure.

7. The method of claim 1 further comprising forming a minimum of one insulating layer and a minimum of one conductor layer over the semiconductor substrate.

* * * * *